(12) United States Patent
Tian et al.

(10) Patent No.: US 12,262,514 B2
(45) Date of Patent: Mar. 25, 2025

(54) HEAT SINKS WITH BEYOND-BOARD FINS

(71) Applicant: International Business Machines Corporation, Armonk, NY (US)

(72) Inventors: Shurong Tian, Mount Kisco, NY (US); Todd Edward Takken, Brewster, NY (US); Joshua M. Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/226,018

(22) Filed: Apr. 8, 2021

(65) Prior Publication Data

US 2022/0330414 A1 Oct. 13, 2022

(51) Int. Cl.
*H05K 7/20* (2006.01)
*H01L 23/367* (2006.01)
*H01L 23/427* (2006.01)
*H05K 1/02* (2006.01)

(52) U.S. Cl.
CPC ..... *H05K 7/20509* (2013.01); *H01L 23/3672* (2013.01); *H01L 23/427* (2013.01); *H05K 1/0203* (2013.01); *H05K 7/205* (2013.01); *H05K 7/2029* (2013.01); *H05K 2201/066* (2013.01)

(58) Field of Classification Search
CPC ............. H05K 7/20509; H05K 1/0203; H05K 2201/066; H01L 23/367–3677
See application file for complete search history.

(56) References Cited

U.S. PATENT DOCUMENTS

| 5,978,223 A | 11/1999 | Hamilton |
| 6,466,441 B1 * | 10/2002 | Suzuki .............. H05K 7/20545 174/16.3 |
| 6,580,611 B1 | 6/2003 | Vandentop |

(Continued)

FOREIGN PATENT DOCUMENTS

| CN | 1450433 A | 10/2003 |
| CN | 101916135 A | 12/2010 |

(Continued)

OTHER PUBLICATIONS

Steven Walton, "Galax's GTX 1070 Katana: single slot Graphics," Techspot, Jun. 7, 2017, Downloaded from the Internet Feb. 10, 2021, https://www.techspot.com/review/1417-galax-gtx-1070-katana-single-slot/.

(Continued)

*Primary Examiner* — Zachary Pape
(74) *Attorney, Agent, or Firm* — Daniel Morris; Otterstedt & Kammer PLLC

(57) ABSTRACT

An apparatus includes a cabinet; an air-mover attached to the cabinet; a circuit board mounted in the cabinet; and an air-cooled heat sink attached in thermal contact with a heat-generating component on the circuit board. The heat sink includes a heat sink base; primary heat removal fins protruding from the heat sink base in a direction away from the circuit board; and secondary heat removal fins protruding from the heat sink base in a direction toward the circuit board. The air-mover is configured to force air between the primary heat removal fins and between the secondary heat removal fins.

14 Claims, 8 Drawing Sheets

(56) References Cited

U.S. PATENT DOCUMENTS

| | | | | |
|---|---|---|---|---|
| 7,391,614 | B2* | 6/2008 | Artman | H01L 23/367 |
| | | | | 257/E23.102 |
| 7,616,445 | B2* | 11/2009 | Lin | H05K 7/205 |
| | | | | 174/16.3 |
| 8,411,444 | B2 | 4/2013 | Gaynes | |
| 8,472,190 | B2* | 6/2013 | Refai-Ahmed | H05K 1/141 |
| | | | | 361/704 |
| 9,773,718 | B2* | 9/2017 | Douglas | H01L 23/427 |
| 9,869,837 | B2* | 1/2018 | Morgan | G06F 1/182 |
| 10,146,275 | B2* | 12/2018 | Ghioni | H01L 23/34 |
| 10,504,813 | B2 | 12/2019 | Davare | |
| 10,616,993 | B1 | 4/2020 | Gawlowski | |
| 10,785,864 | B2* | 9/2020 | Mische | H05K 3/0044 |
| 2003/0189815 | A1 | 10/2003 | Lee | |
| 2005/0128710 | A1* | 6/2005 | Beitelmal | H05K 7/20445 |
| | | | | 361/709 |
| 2005/0207115 | A1* | 9/2005 | Barsun | G06F 1/20 |
| | | | | 257/E23.102 |
| 2012/0206882 | A1* | 8/2012 | Mohammed | H01L 23/3735 |
| | | | | 977/932 |
| 2012/0257355 | A1* | 10/2012 | Yi | G02B 6/4269 |
| | | | | 361/704 |
| 2013/0138262 | A1 | 5/2013 | Busch et al. | |
| 2015/0327394 | A1 | 11/2015 | Davis et al. | |
| 2019/0377392 | A1 | 12/2019 | Mani | |

FOREIGN PATENT DOCUMENTS

| | | |
|---|---|---|
| CN | 103135721 A | 6/2013 |
| CN | 209402822 U | 9/2019 |
| JP | H09232778 A * | 5/1997 |

OTHER PUBLICATIONS

Igor Wallossek, "Sapphire RX Vega 56 Pulse in test—Hot battle dwarf with thick refrigerated tank," Jul. 2, 2018, Downloaded from the Internet Feb. 10, 2021, https://www.igorslab.de/en/sapphire-rx-vega-56-pulse-in-test-hot-fighter-dwarf-with-thick-kuehlpanzer/.

Authorized Officer Ning Su, PRC IP Administration as ISA, ISR and Written Opinion mailed May 30, 2022 in related PCT Application PCT/IB2022/053016 6 pages total.

* cited by examiner

HEAT SINKS WITH BEYOND-BOARD FINS

BACKGROUND

The present invention relates to the electrical, electronic, and computer arts, and more specifically, to heat sinks for circuit board modules.

Typical air-cooled circuit boards have heat-generating modules mounted at a first or top surface of the circuit board, with a heat sink mounted over the heat-generating modules. A base of the heat sink contacts the heat-generating modules. Fins of the heat sink, which protrude from the base opposite the heat-generating modules and away from the circuit board, transfer heat by convection to ambient air. The base extends laterally and serves as a heat spreader, thereby increasing the number of fins that can transfer heat from the heat-generating modules to the air.

SUMMARY

Principles of the invention provide techniques for heat sinks with beyond-board fins. In one aspect, an exemplary apparatus includes a circuit board; one or more heat-generating components attached to a surface of the circuit board; and an air-cooled heat sink attached in thermal contact with at least one of the heat-generating components. The heat sink includes primary heat removal fins protruding away from the circuit board and secondary heat removal fins protruding toward the circuit board.

In another aspect, an air-cooled heat sink includes a base; primary heat removal fins protruding from a first broad surface of the base; and secondary heat removal fins protruding from a second broad surface of the base, opposite the first broad surface. At least some of the secondary heat removal fins border a space configured for receiving a circuit board with heat-generating components mounted to the circuit board in contact with the second broad surface of the base.

In another aspect, a method is provided for cooling a heat-generating component mounted to a circuit board. The method includes obtaining a heat sink that comprises a base, a plurality of primary heat removal fins protruding from a first surface of the base, and a plurality of secondary heat removal fins protruding from a second surface of the base, opposite the first surface. The method includes attaching the heat sink to the circuit board with the second surface of the base in thermal contact with the heat-generating component and with the plurality of secondary heat removal fins protruding from the base beyond the circuit board, and during operation of the heat-generating component, forcing air between the fins of the heat sink by operation of an air-mover (e.g., a blower or fan). Thus, during operation of the heat-generating component, the heat sink dissipates heat through the primary heat removal fins and the secondary heat removal fins.

Another aspect provides a cabinet; an air-mover attached to the cabinet; a circuit board mounted in the cabinet; and an air-cooled heat sink attached in thermal contact with a heat generating component of the circuit board. The heat sink includes a heat sink base; primary heat removal fins protruding from the heat sink base in a direction away from the circuit board; and secondary heat removal fins protruding from the heat sink base in a direction toward the circuit board. The air-mover is configured to force air between the primary heat removal fins and between the secondary heat removal fins.

Another aspect provides a circuit board; one or more heat-generating components attached to a surface of the circuit board; and an air-cooled heat sink attached in thermal contact with at least one of the heat-generating components. The heat sink includes a heat sink base attached in thermal contact with the heat-generating components; and primary heat removal fins protruding from the heat sink base in a direction away from the circuit board. The heat sink base conforms to topology of the circuit board and the heat-generating components such that portions of the heat sink base are closer to the circuit board with correspondingly longer primary fins.

In view of the foregoing, techniques of the present invention can provide substantial beneficial technical effects. For example, one or more embodiments provide one or more of:

Improved thermal performance at minimal cost increase while adhering to form factor restrictions.

Ease of assembly for heat sink system with improved thermal performance within form factor restrictions, compared to separate heat sinks on both sides of a circuit board.

More efficient use of space for cooling circuit board.

DETAILED DESCRIPTION

Figure 1:
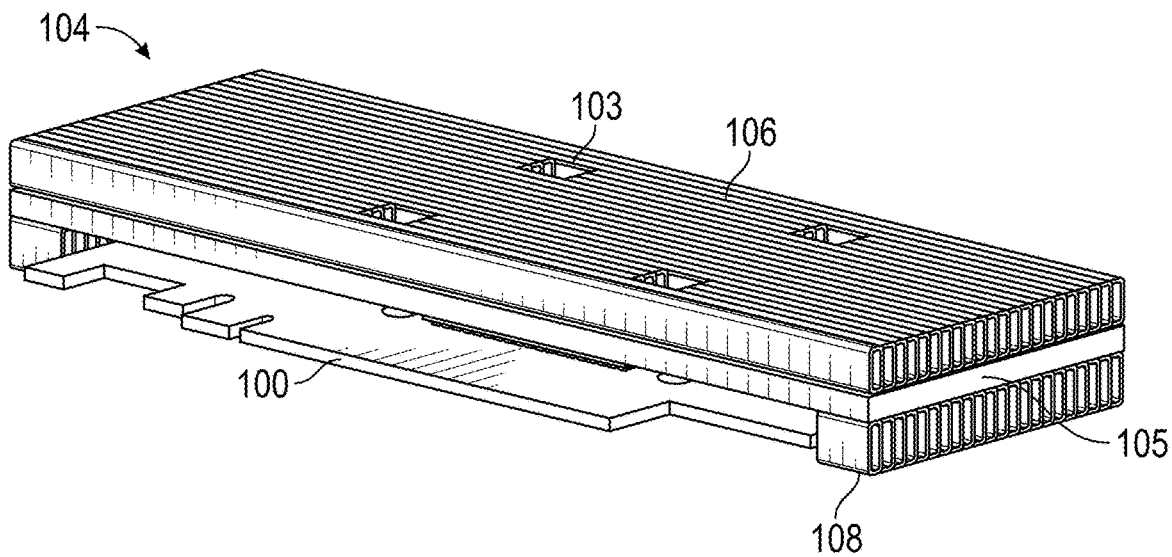
FIG. 1 depicts in perspective view an exemplary embodiment of a heat sink with fins extending beyond a circuit board.
Figure 2:
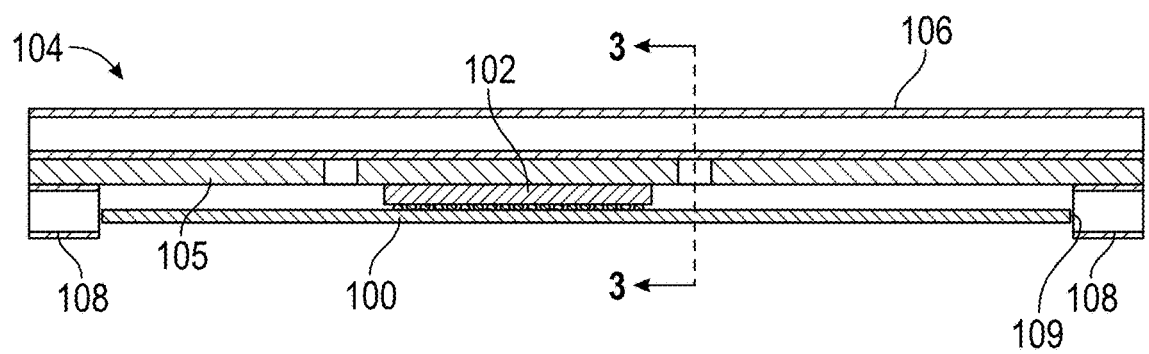
FIG. 2 depicts a cross-sectional view of the heat sink and circuit board shown in FIG. 1, parallel to lengths of the fins, taken along line 2-2 in FIG. 3.
Figure 3:
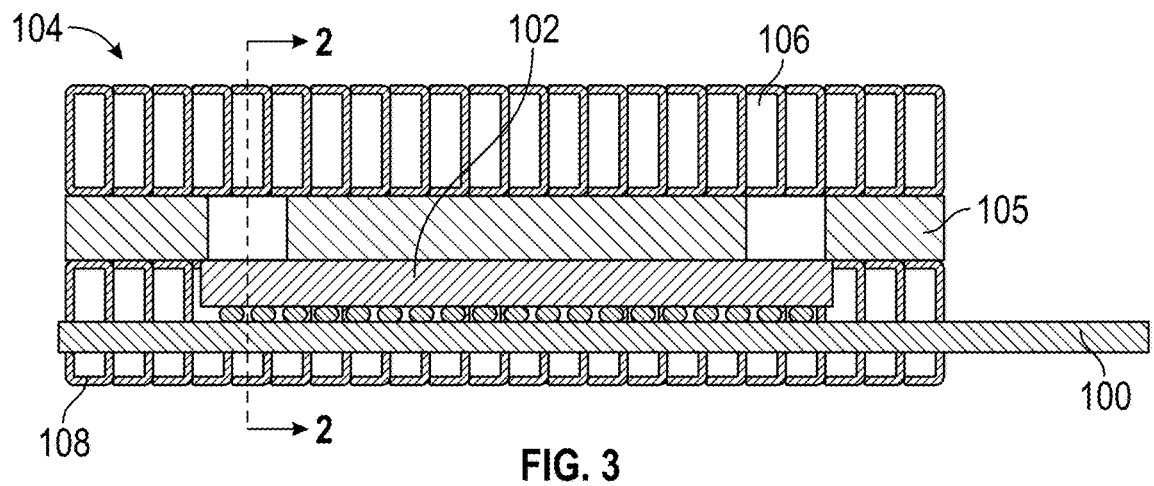
FIG. 3 depicts a cross-sectional view of the heat sink and circuit board shown in FIG. 1, perpendicular to lengths of the fins, taken along line 3-3 in FIG. 2.

FIG. 1, FIG. 2, and FIG. 3 show a circuit board 100 onto which are attached one or more heat-generating components 102 (best seen in FIGS. 2 and 3). Exemplary heat-generating components include processors, random-access or read-only memory, or other computer circuitry. In one or more embodiments, as a non-limiting example, the heat-generating components 102 can be attached by controlled collapse chip connection (C4) technology or other types of solder connections or the like. A heat sink 104 is mounted over the heat-generating components 102. The heat sink 104 includes mounting holes 103 (best seen in FIG. 1) for attaching the heat sink to the circuit board 100. A base 105 of the heat sink 104 contacts the heat-generating components 102 through a thermal interface material of any known type, not shown because not amenable to illustration. Note that thermal interface material, while desirable, is optional in all embodiments. In one or more embodiments, the heat sink base 105 encloses a vapor chamber, which transfers heat from the heat-generating components 102 to primary fins 106 that protrude from the top of the heat sink base 105, opposite the heat-generating components 102 and away from the circuit board 100. Vapor chambers are known to thermal designers and function according to well-understood principles. In other embodiments, the heat sink base 105 is a solid block of metal or other thermally conductive material. The primary fins 106 are fastened to the base 105 and transfer heat from the base 105 by convection to ambient air. In one or more embodiments, the primary fins 106 are formed as C-channels attached to the heat sink base; adjacent primary fins define closed-topped, open-ended passages through which the ambient air flows the length of the heat sink. The heat sink 104 also includes secondary fins 108, which protrude from the base 105 toward and beyond edges 109 (best seen in FIG. 2) of the circuit board 100, opposite the primary fins. The secondary fins 108 also transfer heat from the base 105 by convection to ambient air. Because the secondary fins 108 protrude to the opposite side of the circuit board 100 from the heat-generating components 102, in some instances they protrude into cooler ambient air than is available at the same side as the heat-generating components 102. Moreover, the secondary fins 108 increase the number of fins available within the footprint of the heat sink 104. Thus, the secondary fins 108 enhance the transfer of heat from the base 105 to ambient air. In one or more embodiments, the circuit board 100 is oriented so that the channels formed by the primary fins 106 and the secondary fins 108 run vertically, thereby promoting natural convection of ambient air through the channels in a chimney effect. In one or more embodiments, the circuit board 100 is oriented otherwise and an air-mover (shown in FIG. 10) forces ambient air through the channels formed by the fins. Note that the term "air-mover" as used herein is intended to encompass air-moving devices with any appropriate pressure rise, by way of non-limiting examples, a blower or a fan.

Figure 4:
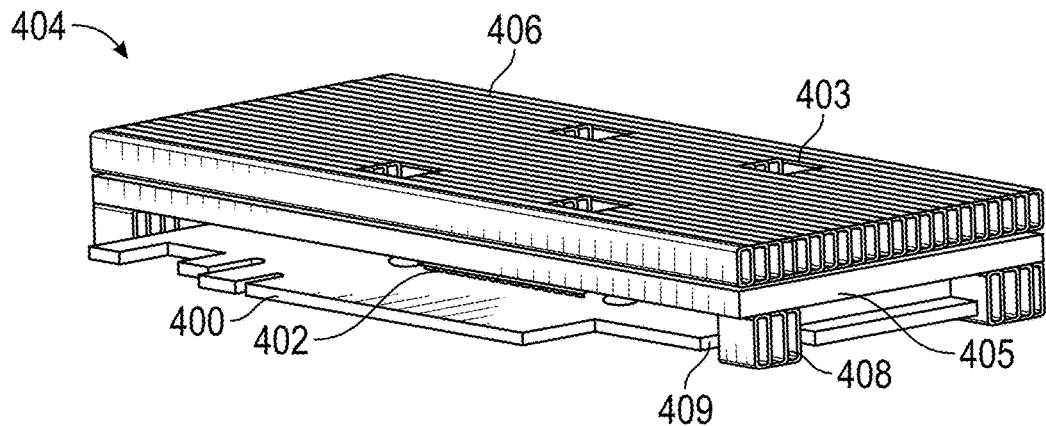
FIG. 4 depicts in perspective view another exemplary embodiment of a heat sink with fins extending beyond a circuit board.
Figure 5:
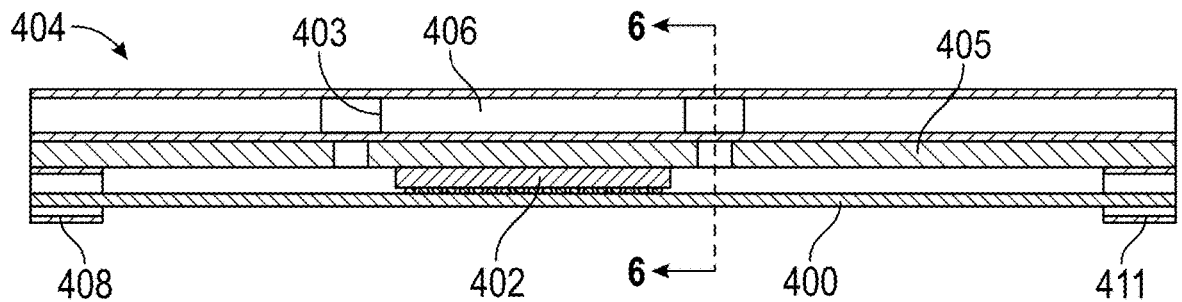
FIG. 5 depicts a cross-sectional view of the heat sink and circuit board shown in FIG. 4, parallel to lengths of the fins, taken along line 5-5 in FIG. 6.
Figure 6:
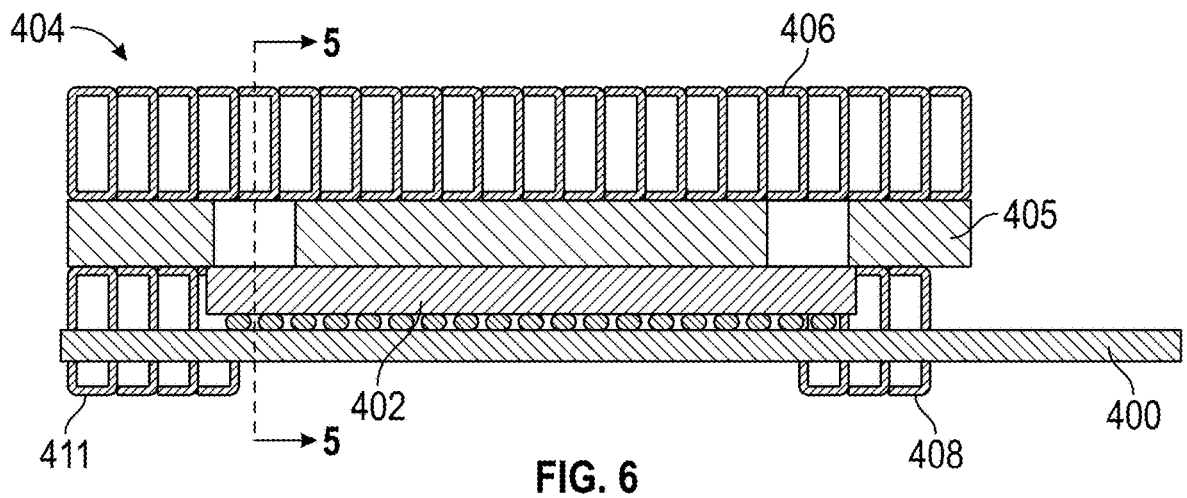
FIG. 6 depicts a cross-sectional view of the heat sink and circuit board shown in FIG. 4, perpendicular to lengths of the fins, taken along line 6-6 in FIG. 5.

FIG. 4, FIG. 5, and FIG. 6 show a circuit board 400 onto which are attached one or more heat-generating components 402 (best seen in FIG. 5 and FIG. 6). A heat sink 404 is mounted over the heat-generating components 402. The heat sink 404 includes mounting holes 403 (best seen in FIG. 4) for attaching the heat sink to the circuit board 400. A base 405 of the heat sink 404 contacts the heat-generating components 402 through a thermal interface material, not shown because not amenable to illustration. Primary fins 406 protrude from the top of the heat sink base 405, opposite the heat-generating components 402 and away from the circuit board 400. The primary fins 406 transfer heat from the base 405 by convection to ambient air. The heat sink 404 also includes secondary fins 408, 411, which protrude from the base 405 toward and beyond notched edges 409 of the circuit board 400, opposite the primary fins. The secondary fins 408, 411 also transfer heat from the base 405 by convection to ambient air. Because the secondary fins 408, 411 protrude to the opposite side of the circuit board 400 from the heat-generating components 402, in some instances they protrude into cooler ambient air than is available at the same side as the heat-generating components 402. Moreover, the secondary fins 408, 411 increase the number of fins available within the footprint of the heat sink 404. Thus, the secondary fins 408, 411 enhance the transfer of heat from the base 405 to ambient air. In one or more embodiments, a first group 408 of the secondary fins have a different pitch, height, and/or thickness than have a second group 411 of the secondary fins. Such variations equally are applicable (although not explicitly shown) to the embodiments of FIG. 1 and FIG. 7.

Figure 7:
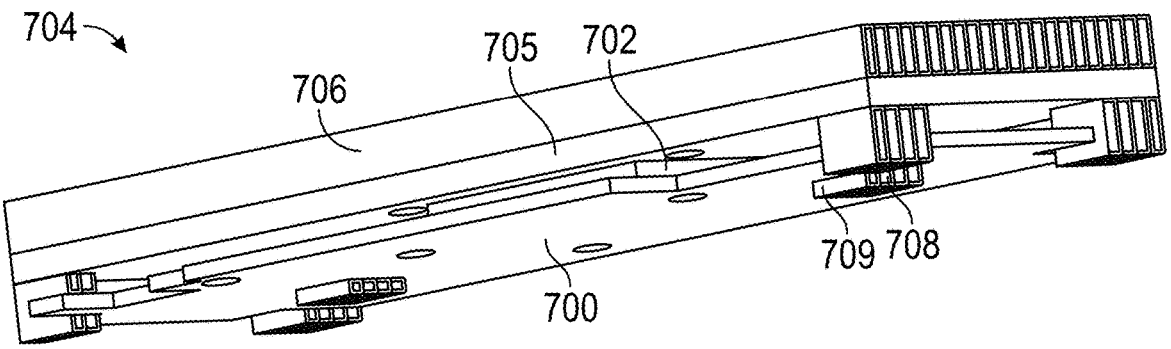
FIG. 7 depicts in perspective view another embodiment of a heat sink with fins extending through a circuit board.
Figure 8:
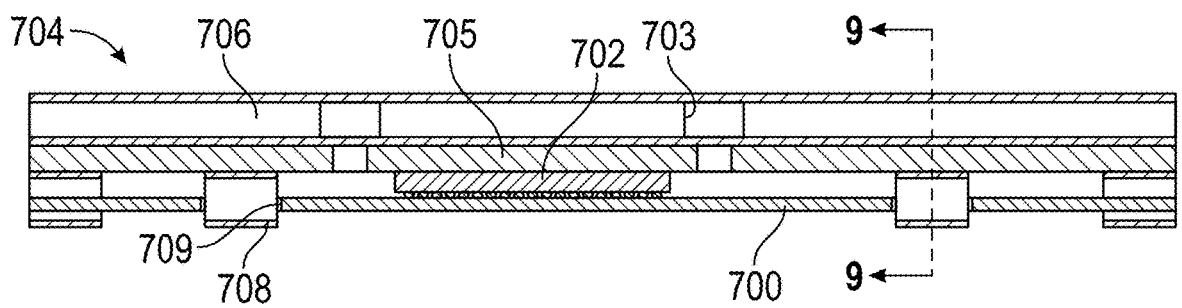
FIG. 8 depicts a cross-sectional view of the heat sink and circuit board shown in FIG. 7, parallel to lengths of the fins, taken along line 8-8 in FIG. 9.
Figure 9:
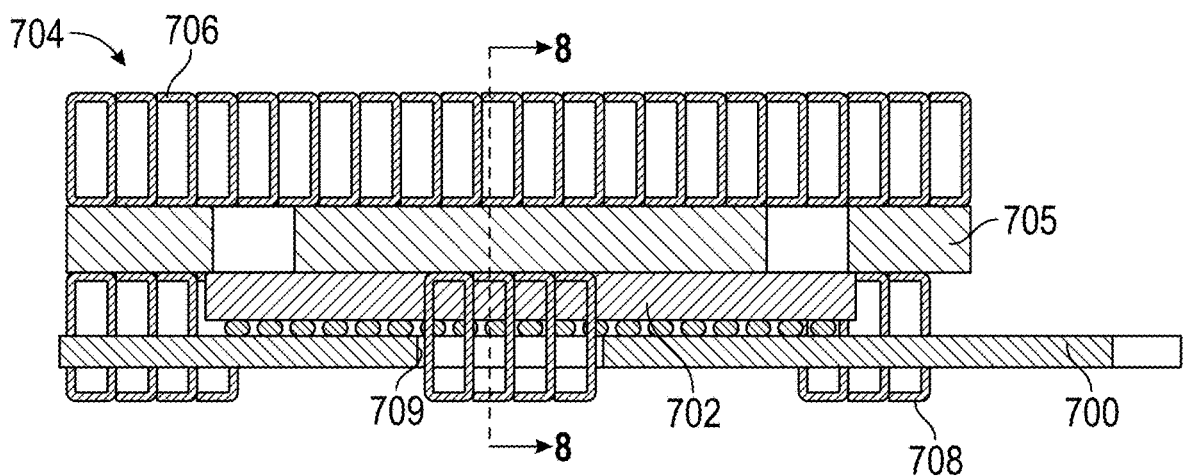
FIG. 9 depicts a cross-sectional view of the heat sink and circuit board shown in FIG. 7, perpendicular to lengths of the fins, taken along line 9-9 in FIG. 8.

FIG. 7, FIG. 8, and FIG. 9 show a circuit board 700 onto which are attached one or more heat-generating components 702 (better seen in FIG. 8 and FIG. 9). A heat sink 704 is mounted over the heat-generating components 702. The heat sink 704 includes mounting holes 703 for attaching the heat sink to the circuit board 700. A base 705 of the heat sink 704 contacts the heat-generating components 702 through a thermal interface material, not shown because not amenable to illustration. Primary fins 706 protrude from the top of the heat sink base 705, opposite the heat-generating components 702 and away from the circuit board 700. The primary fins 706 transfer heat from the base 705 by convection to ambient air. The heat sink 704 also includes secondary fins 708, which protrude from the base 705 through cutouts 709 of the circuit board 700, opposite the primary fins. The secondary fins 708 also transfer heat from the base 705 by convection to ambient air. Because the secondary fins 708 protrude to the opposite side of the circuit board 700 from the heat-generating components 702, in some instances they protrude into cooler ambient air than is available at the same side as the heat-generating components 702. Moreover, the secondary fins 708 increase the number of fins available within the footprint of the heat sink 704. Thus, the secondary fins 708 enhance the transfer of heat from the base 705 to ambient air.

Figure 10:
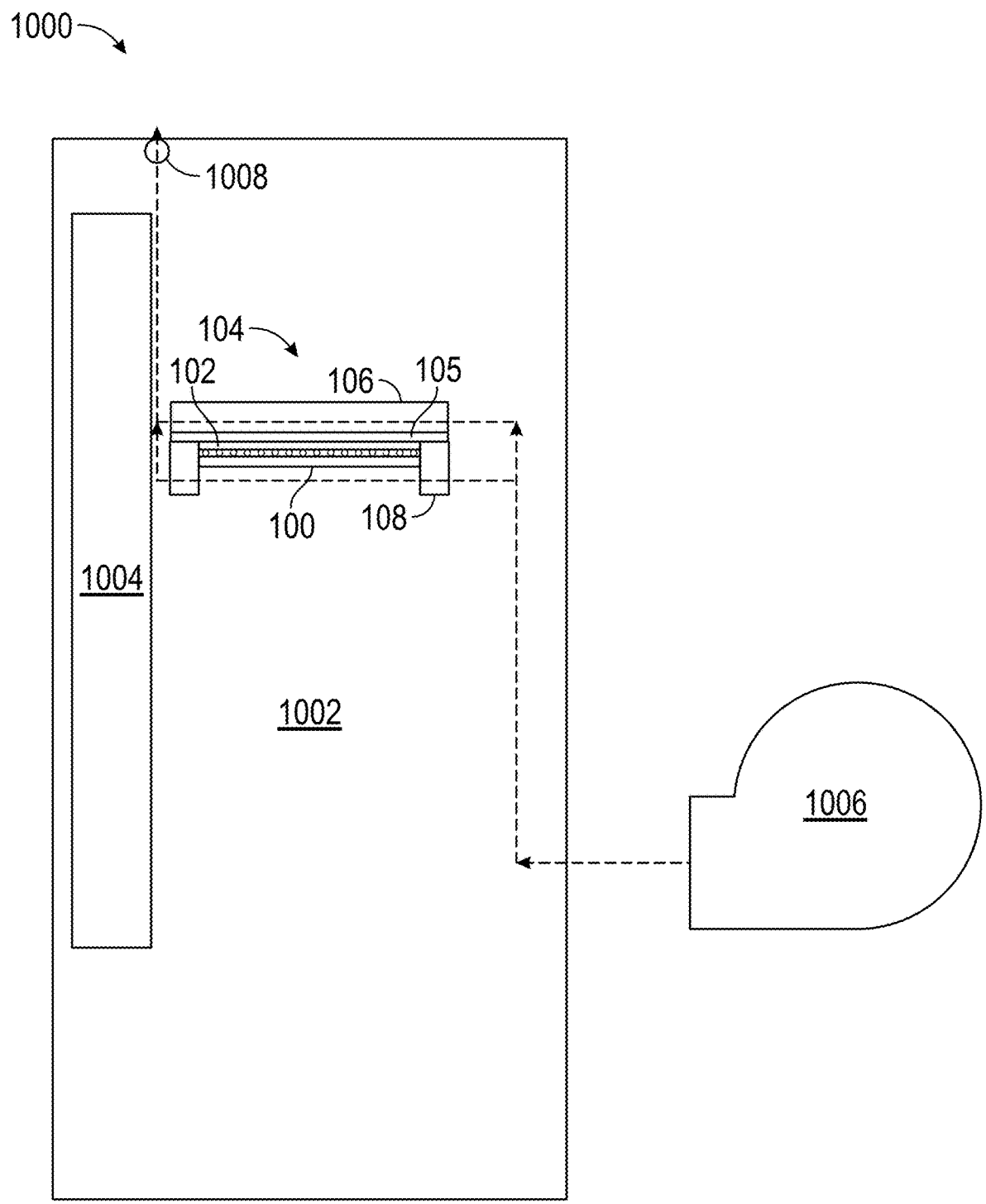
FIG. 10 depicts a schematic of a cabinet that encloses a heat sink and circuit board, according to an exemplary embodiment.

FIG. 10 shows in a schematic view an assembly 1000 that can include any of the embodiments shown herein. Referring for example to the embodiment of FIG. 1 through FIG. 3, the assembly 1000 includes a cabinet 1002 in which the circuit board 100 is mounted. Optionally, the circuit board 100 is mounted to a backplane 1004. An air-mover (e.g., a blower or fan) 1006 forces ambient air through the channels of the heat sink 104 (between the primary fins 106 and between the secondary fins 108 around the base 105) and the air is exhausted from the cabinet 1002 through a vent 1008. The air-mover can be connected to the inter-fin (closed) channels via suitable ducting and an inlet plenum, and the air can pass from the inter-fin channels to the vent 1008 through an exit plenum and suitable ducting, for example. In another aspect, open channels between the fins could be used and the air-mover can simply supply air to the cabinet interior. Also, the air-mover can be provided at the inlet or outlet as desired.

Figure 11:
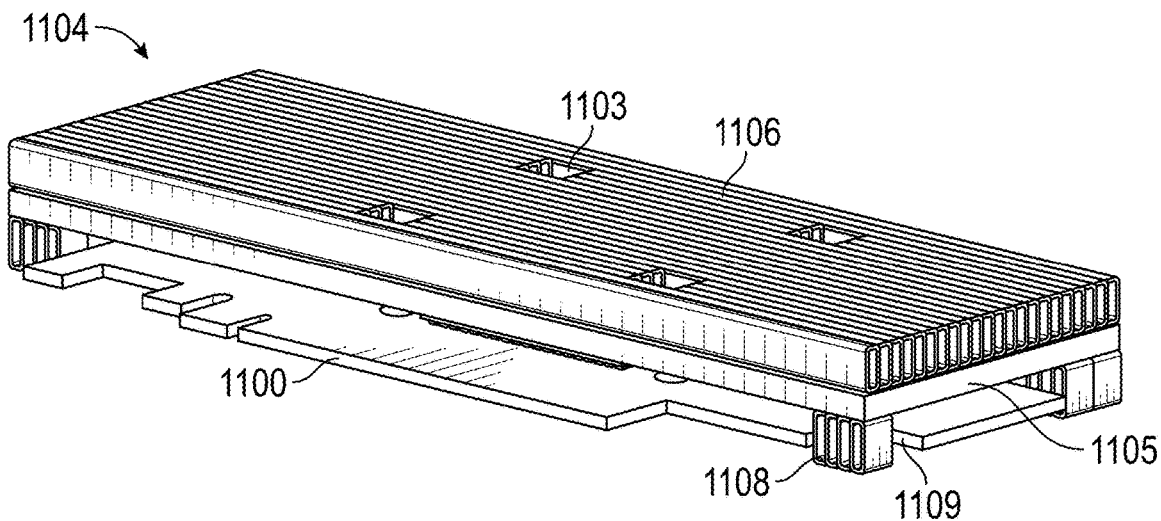
FIG. 11 depicts in perspective view another embodiment of a heat sink with fins extending beyond a circuit board.
Figure 12:
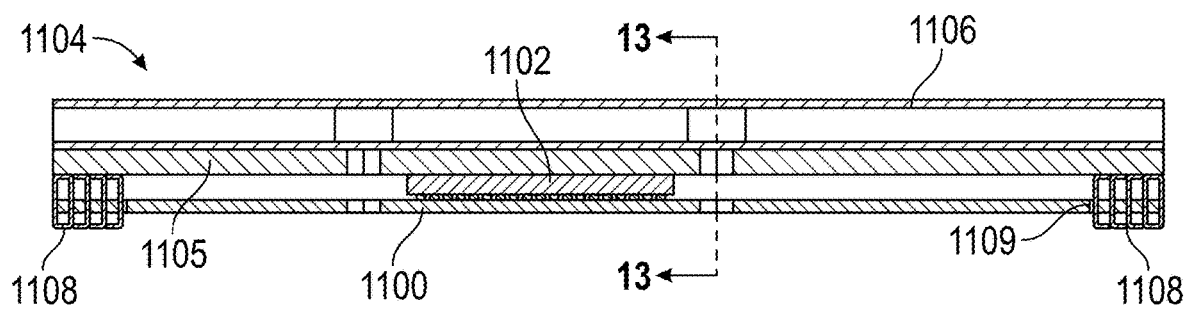
FIG. 12 depicts a cross-sectional view of the heat sink and circuit board shown in FIG. 11, parallel to lengths of the upper fins, taken along line 12-12 in FIG. 13.
Figure 13:
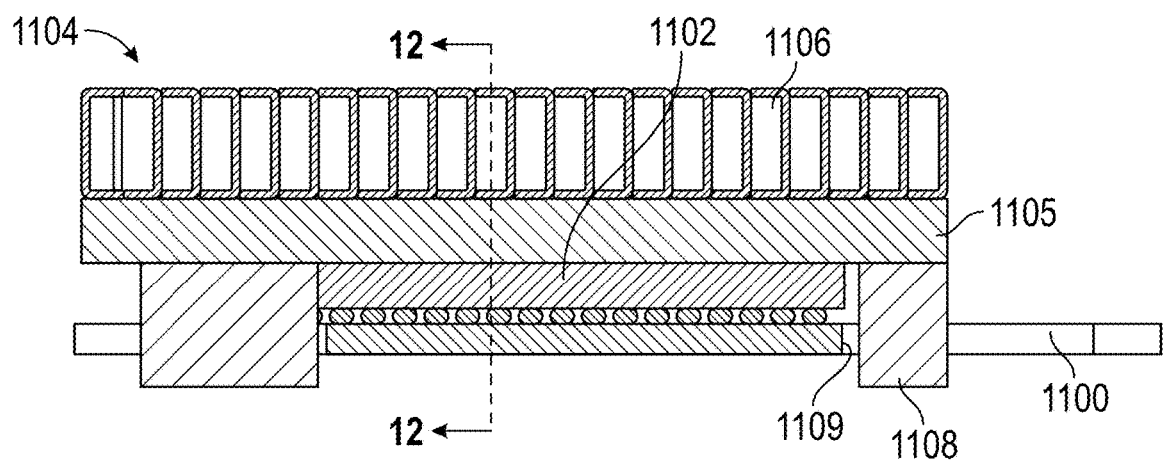
FIG. 13 depicts a cross-sectional view of the heat sink and circuit board shown in FIG. 11, parallel to lengths of the lower fins, taken along line 13-13 in FIG. 12.

FIG. 11, FIG. 12, and FIG. 13 depict another embodiment of a heat sink 1104 with fins 1108 extending beyond a circuit board 1100. One or more heat-generating components 1102 (better seen in FIG. 12 and FIG. 13) are attached to the circuit board 1100. The heat sink 1104 is mounted over the heat-generating components 1102. The heat sink 1104 includes mounting holes 1103 for attaching the heat sink to the circuit board 1100. A base 1105 of the heat sink 1104 contacts the heat-generating components 1102 through a thermal interface material, not shown because not amenable to illustration. Primary fins 1106 protrude from the top of the heat sink base 1105, opposite the heat-generating components 1102 and away from the circuit board 1100. The primary fins 1106 transfer heat from the base 1105 by convection to ambient air. The heat sink 1104 also includes secondary fins 1108, which protrude from the base 1105 through cutouts 1109 of the circuit board 1100, opposite the primary fins. The secondary fins 1108 also transfer heat from the base 1105 by convection to ambient air. Because the secondary fins 1108 protrude to the opposite side of the circuit board 1100 from the heat-generating components 1102, in some instances they protrude into cooler ambient air than is available at the same side as the heat-generating components 1102. Moreover, the secondary fins 1108 increase the number of fins available within the footprint of the heat sink 1104. Thus, the secondary fins 1108 enhance the transfer of heat from the base 1105 to ambient air.

Figure 14:
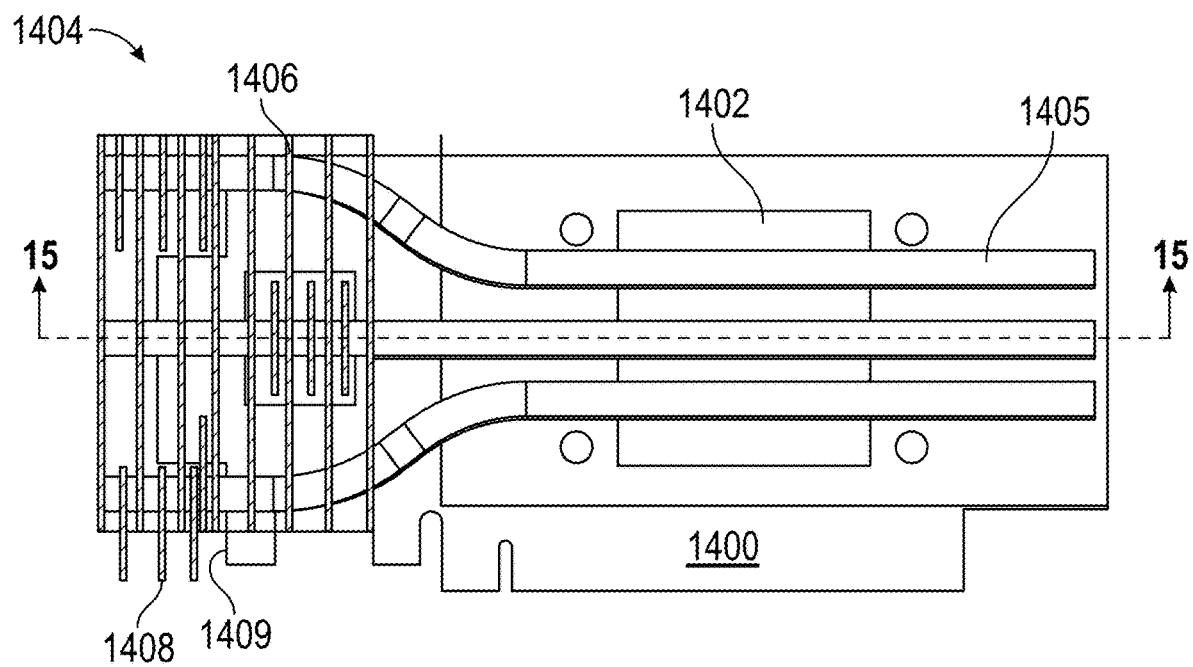
FIG. 14 depicts a top view of a circuit board with heat pipes and cooling fins, according to an exemplary embodiment.
Figure 15:
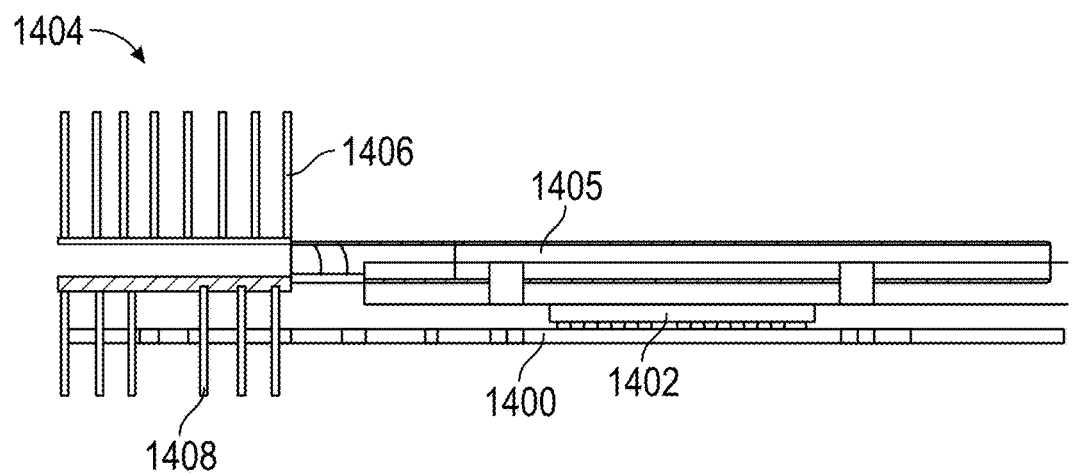
FIG. 15 depicts a side view of the circuit board, heat pipes, and cooling fins shown in FIG. 14.

FIG. 14 and FIG. 15 depict a circuit board 1400 to which is mounted a heat sink 1404 with heat pipes 1405 and cooling fins 1406, 1408, according to an exemplary embodiment. One or more heat-generating components 1402 are attached to the circuit board 1400. The heat sink 1404 is mounted over the heat-generating components 1402. The heat sink 1404 includes the heat pipes 1405, which contact the heat-generating components 1402 through a thermal interface material, not shown because not amenable to illustration. Primary fins 1406 protrude from the heat pipes 1405 away from the circuit board 1400. The primary fins 1406 transfer heat from the heat pipes 1405 by convection to ambient air. The heat sink 1404 also includes secondary fins 1408, which protrude from the heat pipes 1405 through cutouts 1409 of the circuit board 1400, opposite the primary fins. The secondary fins 1408 also transfer heat from the heat pipes 1405 by convection to ambient air. Because the secondary fins 1408 protrude to the opposite side of the circuit board 1400 from the heat-generating components 1402, in some instances they protrude into cooler ambient air than is available at the same side as the heat-generating components 1402. Moreover, the secondary fins 1408 increase the number of fins available within the footprint of the heat sink 1404. Thus, the secondary fins 1408 enhance the transfer of heat from the heat pipes 1405 to ambient air. The skilled artisan will be familiar with the use of heat pipes as reflux boilers or with suitable wicking structures enabling operation against gravity. The heat from the components 1402 can enter the heat pipes in evaporator regions and be rejected from the heat pipes in condenser sections near the fins 1406, 1408.

Figure 16:
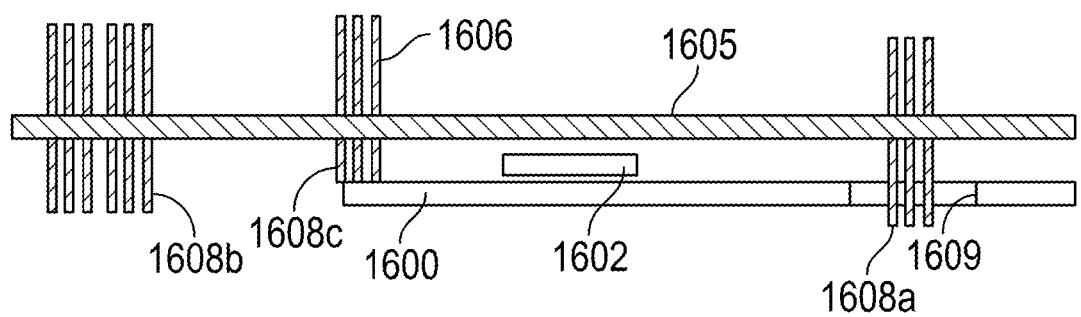
FIG. 16 depicts a schematic side view of a circuit board and heat sink, according to an exemplary embodiment.

FIG. 16 depicts a schematic side view of a circuit board 1600 and heat sink 1604, according to an exemplary embodiment. One or more heat-generating components 1602 are attached to the circuit board 1600. The heat sink 1604 is mounted to the circuit board 1600 over the heat-generating components 1602. The heat sink 1604 includes a base 1605, which contacts the heat-generating components 1602 through a thermal interface material, not shown because not amenable to illustration. Primary fins 1606 protrude from the base 1605 away from the circuit board 1600. Secondary fins 1608a, 1608b, 1608c protrude from the base 1605 toward and beyond the circuit board 1600. In one or more embodiments, at least some of the secondary fins 1608a, 1608b, 1608c have different thickness, pitch, and/or height than each other and/or than at least some of the primary fins 1606. Similar variations of thickness, pitch, and/or height are equally applicable to embodiments of the other drawing figures, even if not explicitly shown. Some of the secondary fins 1608a protrude through a cutout 1609 of the circuit board 1600. Other secondary fins 1608b protrude beyond an edge of the circuit board 1600. Other secondary fins 1608c protrude down to but not beyond the circuit board 1600. Because at least some of the secondary fins 1608 protrude to the opposite side of the circuit board 1600 from the heat-generating components 1602, in some instances they protrude into cooler ambient air than is available at the same side as the heat-generating components 1602. Moreover, the secondary fins 1608 increase the number of fins available within the footprint of the heat sink 1604. Thus, the secondary fins 1608 enhance the transfer of heat from the base 1605 to ambient air.

Figure 17:
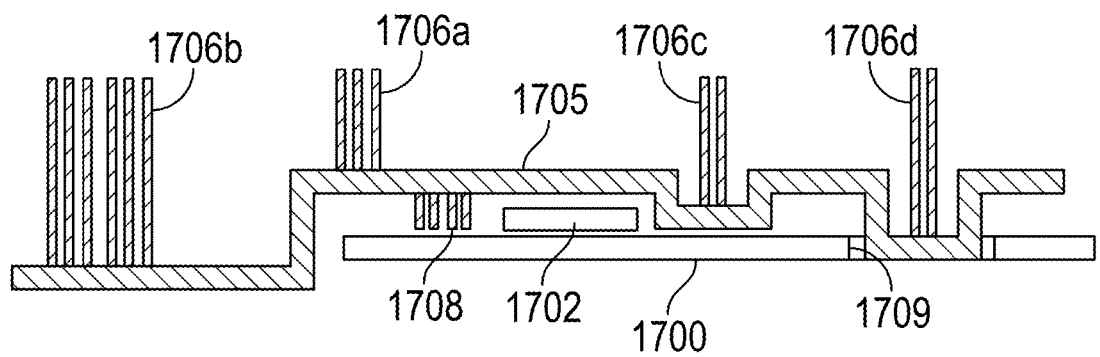
FIG. 17 depicts a schematic side view of a circuit board and heat sink, according to an exemplary embodiment.

FIG. 17 depicts a schematic side view of a circuit board 1700 and heat sink 1704, according to an exemplary embodiment. One or more heat-generating components 1702 are attached to the circuit board 1700. The heat sink 1704 includes a base 1705 that is mounted to the circuit board 1700 and contacts the heat-generating components 1702 via a thermal interface material, not shown because not amenable to illustration. The base 1705 is conformed to the topography of the circuit board 1700. Additionally, the base 1705 includes portions that are offset to protrude beyond the circuit board 1700, including a portion that protrudes through a cutout 1709 of the circuit board 1700. Accordingly, the base 1705 supports fins of varying heights, e.g., a first group of shorter fins 1706a, a second group of longer fins 1706b, and groups of intermediate-height fins 1706c, 1706d. Additionally, secondary fins 1708 protrude from an underside of the base 1705 toward the circuit board 1700. Where it is possible within the footprint of the heat sink 1704 to have the longer fins 1706b and intermediate-height fins 1706c, 1706d, the increased height of these fins improves heat transfer from the heat sink base 1705 to ambient air.

In both FIG. 16 and FIG. 17, "open" fins are shown that are compatible with natural (i.e., free convection) or forced air convective cooling. Equally, "closed" channel fins could be used with forced air convective cooling.

Figure 18:
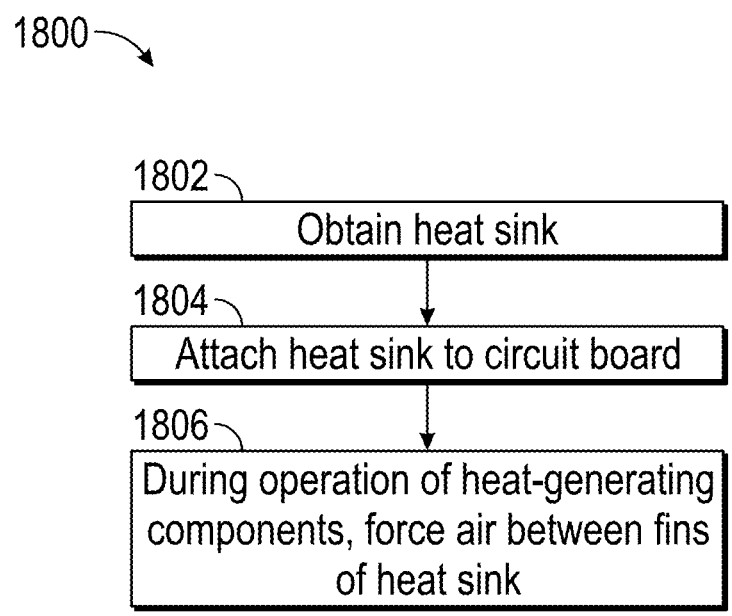
FIG. 18 depicts in a flowchart a method for cooling a circuit board, according to an exemplary embodiment.

Referring to FIG. 18, a method 1800 is provided for cooling a heat-generating component 102 mounted to a circuit board 100. The method comprises at 1802, obtaining a heat sink 104 that comprises a base 105, a plurality of primary heat removal fins 106 protruding from a first surface of the base, and a plurality of secondary heat removal fins 1808 protruding from a second surface of the base, opposite the first surface. Additionally, at 1804, attach the heat sink 104 to the circuit board 100 with the second surface of the base 105 in thermal contact with the heat-generating component 102 and with the plurality of secondary heat removal fins 108 protruding from the base beyond the circuit board. Then at 1806, during operation of the heat-generating component, force air between the fins of the heat sink by operation of an air-mover (e.g., a blower or fan). During operation of the heat-generating component, the heat sink dissipates heat through the primary heat removal fins and the secondary heat removal fins.

Given the discussion thus far, it will be appreciated that, in general terms, an exemplary apparatus comprises a circuit board 100; one or more heat-generating components 102 attached to a surface of the circuit board; and an air-cooled heat sink 104 attached in thermal contact with at least one of the heat-generating components, the heat sink comprising: primary heat removal fins 106 protruding away from the circuit board; and secondary heat removal fins 108 protruding toward the circuit board. In one or more embodiments, the secondary heat removal fins protrude beyond the circuit board. In one or more embodiments, the primary and secondary heat removal fins protrude from a heat sink base that encloses a vapor chamber. In one or more embodiments, the heat sink base is configured to dissipate heat from the heat-generating components through a wall of the heat sink base to the secondary heat removal fins and through the vapor chamber to the primary heat removal fins. In one or more embodiments, the secondary heat removal fins have a different fin pitch than the primary heat removal fins have. In one or more embodiments, the secondary heat removal fins extend along a different direction than the primary heat removal fins. In one or more embodiments, the secondary heat removal fins have a different height than the primary heat removal fins have. In one or more embodiments, the secondary heat removal fins have a different thickness than the primary heat removal fins have. In one or more embodiments, at least some of the secondary heat removal fins extend through notches formed in edges of the circuit board. In one or more embodiments, the notches are formed at corners of the edges of the circuit board. In one or more embodiments, at least some of the secondary heat removal fins extend through holes formed in the circuit board. In one or more embodiments, the heat sink includes a base to which the primary and secondary heat removal fins are attached, wherein the secondary heat removal fins include a first group of fins of a first height extending from the heat sink base toward the circuit board and a second group of fins of a second height extending from the heat sink base beyond the circuit board. In one or more embodiments, the secondary heat removal fins include a first group of fins of a first fin pitch and a second group of fins of a second fin pitch different than the first fin pitch. In one or more embodiments, the secondary heat removal fins include a first group of fins of a first fin thickness and a second group of fins of a second fin thickness different than the first fin thickness. In one or more embodiments, the primary and secondary heat removal fins protrude from a heat pipe that runs from at least one of the heat-generating components across the circuit board and beyond an edge of the circuit board.

According to another aspect, an air-cooled heat sink 104 comprises: a base 105; primary heat removal fins 106 protruding from a first broad surface of the base; and secondary heat removal fins 108 protruding from a second broad surface of the base, opposite the first broad surface; wherein at least some of the secondary heat removal fins 108 border a space configured for receiving a circuit board 100 with heat-generating components 102 mounted to the circuit board in contact with the second broad surface of the base.

According to another aspect, an exemplary method 1800 is provided for cooling a heat-generating component 102 mounted to a circuit board 100, the method comprising: at 1802, obtaining a heat sink 104 that comprises a base 105, a plurality of primary heat removal fins 106 protruding from a first surface of the base, and a plurality of secondary heat removal fins 1808 protruding from a second surface of the base, opposite the first surface; at 1804, attaching the heat sink 104 to the circuit board 100 with the second surface of the base 105 in thermal contact with the heat-generating component 102 and with the plurality of secondary heat removal fins 108 protruding from the base beyond the circuit board; and at 1806, during operation of the heat-generating component, forcing air between the fins of the heat sink by operation of an air-mover (e.g., a blower or fan). During operation of the heat-generating component, the heat sink dissipates heat through the primary heat removal fins and the secondary heat removal fins.

According to another aspect, an exemplary apparatus comprises: a cabinet 1002; an air-mover 1006 attached to the cabinet; a circuit board 100 mounted in the cabinet; one or more heat-generating components 102 on the circuit board; and an air-cooled heat sink 104 attached in thermal contact with at least one of the heat-generating components, the heat sink comprising: a heat sink base 105; primary heat removal fins 106 protruding from the heat sink base in a direction away from the circuit board; and secondary heat removal fins 108 protruding from the heat sink base in a direction toward the circuit board; wherein the air-mover is configured to force air between the primary heat removal fins and between the secondary heat removal fins. In one or more embodiments, the heat sink base 1405 comprises a heat pipe. In one or more embodiments, the heat sink base comprises a vapor chamber.

According to another aspect, an exemplary apparatus comprises: a circuit board 1700; one or more heat-generating components 1702 attached to a surface of the circuit board; and an air-cooled heat sink 1704 attached in thermal contact with at least one of the heat-generating components, the heat sink comprising: a heat sink base 1705 attached in thermal contact with the heat-generating components; and primary heat removal fins 1706 protruding from the heat sink base in a direction away from the circuit board; wherein the heat sink base conforms to topology of the circuit board and the heat-generating components such that portions of the heat sink base are closer to the circuit board with correspondingly longer primary fins. In one or more embodiments, the heat sink further comprises secondary heat removal fins 1708 protruding from the heat sink base in a direction toward the circuit board. In one or more embodiments, the primary heat removal fins 1706 have a different height than the secondary heat removal fins 1708 have. In one or more embodiments, the primary heat removal fins have a different fin pitch than the secondary heat removal fins have. In one or more embodiments, the primary heat removal fins comprise a first group with a first fin pitch and a second group with a second fin pitch different than the first fin pitch.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a circuit board;

one or more heat-generating components attached to a surface of the circuit board, wherein each of the heat-generating components has a top surface facing away from the circuit board; and an air-cooled heat sink attached in thermal contact with the top surface of at least one of the one or more heat-generating components, the heat sink comprising:

a heat sink base;

primary heat removal fins protruding from the heat sink base in a direction away from the circuit board, wherein the primary heat removal fins have air gaps therebetween; and secondary heat removal fins protruding from the heat sink base in a direction toward the circuit board, wherein:

a first portion of the secondary heat removal fins extend from the heat sink base through a hole formed in the circuit board at a position laterally offset from the heat-generating component, wherein the first portion of secondary heat removal fins have air gaps therebetween, a second portion of the secondary heat removal fins extend from the heat sink base to abut the circuit board, wherein the second portion of secondary heat removal fins have air gaps therebetween, and a third portion of the secondary heat removal fins extend from the heat sink base, laterally past an edge of the circuit board, and protrude down beyond the circuit board, wherein the third portion of secondary heat removal fins have air gaps therebetween; and the primary heat removal fins comprise a first portion of the primary heat removal fins opposite the first portion of the secondary heat removal fins, a second portion of the primary heat removal fins opposite the second portion of the secondary heat removal fins, and a third portion of the primary heat removal fins opposite the third portion of the secondary heat removal fins;

the first portion of the secondary heat removal fins have a greater height than the first portion of the primary heat removal fins have;

the second portion of the secondary heat removal fins have a smaller height than the second portion of the primary heat removal fins have; and the third portion of the secondary heat removal fins have a smaller height than the third portion of the primary heat removal fins have.

2. The apparatus of claim 1, wherein the heat sink base encloses a vapor chamber.

3. The apparatus of claim 2, wherein the heat sink base is configured to dissipate heat from the heat-generating components, through the vapor chamber to both the primary and secondary heat removal fins.

4. The apparatus of claim 1, wherein the secondary heat removal fins have a different fin pitch than the primary heat removal fins have.

5. The apparatus of claim 1, wherein the secondary heat removal fins have a different thickness than the primary heat removal fins have.

6. The apparatus of claim 1, wherein the secondary heat removal fins include a first group of fins of a first fin pitch and a second group of fins of a second fin pitch different than the first fin pitch.

7. The apparatus of claim 1, wherein the secondary heat removal fins include a first group of fins of a first fin thickness and a second group of fins of a second fin thickness different than the first fin thickness.

8. The apparatus of claim 1, wherein the second portion of the secondary heat removal fins have a same thickness as the second portion of the primary heat removal fins.

9. The apparatus of claim 1, wherein the second portion of the secondary heat removal fins have a same thickness as the primary heat removal fins.

10. A method for cooling a heat-generating component mounted to a circuit board, the method comprising:

obtaining a heat sink that comprises;
a heat sink base,
a plurality of primary heat removal fins protruding from a first surface of the heat sink base, and
a plurality of secondary heat removal fins protruding from a second surface of the heat sink base, opposite the first surface;

attaching the heat sink to the circuit board with the second surface of the heat sink base in thermal contact with a surface of the heat-generating component that faces away from the circuit board and with a first portion of the plurality of secondary heat removal fins protruding from the heat sink base through a hole in the circuit board at a position laterally offset from the heat-generating component, a second portion of the plurality of secondary heat removal fins protruding from the heat sink base to abut the circuit board, and a third portion of the plurality of secondary heat removal fins protruding from the heat sink base, laterally past an edge of the circuit board, and protrude down beyond the circuit board; wherein the plurality of primary heat removal fins comprise a first portion of the plurality of primary heat removal fins opposite the first portion of the plurality of secondary heat removal fins, a second portion of the plurality of primary heat removal fins opposite the second portion of the plurality of secondary heat removal fins, and a third portion of the plurality of primary heat removal fins opposite the third portion of the plurality of secondary heat removal fins; the first portion of the plurality of secondary heat removal fins have a greater height than the first portion of the plurality of primary heat removal fins have; the second portion of the plurality of secondary heat removal fins have a smaller height than the second portion of the plurality of primary heat removal fins have; and the third portion of the plurality of secondary heat removal fins have a smaller height than the third portion of the plurality of primary heat removal fins have; and during operation of the heat-generating component, forcing air between the plurality of primary and secondary heat removal fins of the heat sink by operation of an air-mover;

wherein during operation of the heat-generating component, the heat sink dissipates heat through the plurality of primary heat removal fins and the plurality of secondary heat removal fins.

11. An apparatus comprising:
a circuit board;
one or more heat-generating components attached to a surface of the circuit board; and
an air-cooled heat sink attached in thermal contact with at least one of the heat-generating components, the heat sink comprising:
a heat sink base attached in thermal contact with a surface of the heat-generating component that faces away from the circuit board;
primary heat removal fins protruding from the heat sink base in a direction away from the circuit board; and secondary heat removal fins protruding from the heat sink base in a direction toward the circuit board;

wherein the heat sink base conforms to topology of the circuit board and the heat-generating components such that a first portion of the heat sink base is attached in thermal contact with a surface of the heat-generating component that faces away from the circuit board, a second portion of the heat sink base laterally spaced from the first portion is closer to the circuit board than the first portion, a third portion of the heat sink base laterally spaced from the first and second portions extends into a cutout in the circuit board, and a fourth portion of the heat sink base laterally spaced from the first, second, and third portions extends laterally beyond an edge of the circuit board and below the circuit board, such that a first portion of the primary fins extending from the fourth portion of the base are longer than a third portion of the primary fins extending from the third portion of the base, which third portion of the primary fins are in turn longer than a second portion of the primary fins extending from the second portion of the heat sink base, which second portion of the primary fins are in turn longer than a first portion of the primary fins extending from the first portion of the heat sink base.

12. The apparatus of claim 11, wherein the primary heat removal fins have different heights than the secondary heat removal fins have.

13. The apparatus of claim 11, wherein the primary heat removal fins have a different fin pitch than the secondary heat removal fins have.

14. The apparatus of claim 11, wherein the primary heat removal fins comprise a first group with a first fin pitch and a second group with a second fin pitch different than the first fin pitch.

* * * * *